(12) United States Patent
Wu (10) Patent No.: US 11,495,584 B2
(45) Date of Patent: Nov. 8, 2022

(54) MODULAR DISTRIBUTED CONTROL LED DISPLAY SYSTEM

(71) Applicant: Shenzhen Chip Optech Co. Ltd., Shenzhen (CN)

(72) Inventor: XiaoGang Wu, Shenzhen (CN)

(73) Assignee: Shenzhen Chip Optech Co. Ltd., Shenzhen (CN)

( * ) Notice: Subject to any disclaimer, the term of this patent is extended or adjusted under 35 U.S.C. 154(b) by 207 days.

(21) Appl. No.: 16/920,665

(22) Filed: Jul. 4, 2020

(65) Prior Publication Data

US 2021/0005585 A1 Jan. 7, 2021

(30) Foreign Application Priority Data

Jul. 4, 2019 (CN) .......................... 201910597100.X (51) Int. Cl.

| | |
|---|---|
| *H01L 25/075* | (2006.01) |
| *G09G 3/32* | (2016.01) |
| *H01L 33/62* | (2010.01) |
| *H01L 33/24* | (2010.01) |
| *H01L 25/07* | (2006.01) |
| *G09F 9/33* | (2006.01) |
| *G09F 9/302* | (2006.01) |
| *G06F 3/14* | (2006.01) |
| *G09F 13/04* | (2006.01) |
| *G06F 1/16* | (2006.01) |
| *G06F 1/18* | (2006.01) |

(52) U.S. Cl.
CPC ........ *H01L 25/0753* (2013.01); *G06F 3/1446* (2013.01); *G09F 9/3026* (2013.01); *G09F 9/33* (2013.01); *G09F 13/0413* (2013.01); *G09G 3/32* (2013.01); *H01L 25/073* (2013.01); *H01L 33/24* (2013.01); *H01L 33/62* (2013.01); *G06F 1/1601* (2013.01); *G06F 1/182* (2013.01); *G09F 9/3023* (2013.01)

(58) Field of Classification Search
CPC ... H01L 25/0753; H01L 25/073; H01L 33/24; H01L 33/62; G06F 3/1446; G06F 1/182; G06F 1/1601; G09F 9/3026; G09F 9/33; G09F 13/0413; G09F 9/3023; G09G 3/32
See application file for complete search history.

(56) References Cited

U.S. PATENT DOCUMENTS

| | | | |
|---|---|---|---|
| 7,869,198 B1 * | 1/2011 | Nearman .............. | G09F 9/3026 |
| | | | 292/201 |
| 2018/0151096 A1 * | 5/2018 | Hall ................... | H05K 7/20127 |

* cited by examiner

*Primary Examiner* — Patricia D Valenzuela
(74) *Attorney, Agent, or Firm* — Novoclaims Patent Services LLC; Mei Lin Wong (57) ABSTRACT

A modular distributed control LED display system, comprising several LED display module units (100) which are spliced together to form an integrated LED display screen, each of the LED display module units (100) comprises a lamp board (110) and an independent controller (120), wherein the lamp board (110) is provided with a number of LED light sources, and the independent controller (120) is provided on the back of the lamp board (110), the independent controller (120) is used to control the working state and display mode of the LED light sources.

4 Claims, 15 Drawing Sheets

MODULAR DISTRIBUTED CONTROL LED DISPLAY SYSTEM

FIELD OF THE INVENTION

The present invention relates to an LED display system, in particular to a modular LED display system including a plurality of LED display module units which are assembled and connected together to form an integrated LED display screen.

PRIOR ART

The LED display screen is a flat panel display assembled by several small LED modules, and is used to display text, images, videos and video signals.

At present, LED display screens have been widely used in many fields such as outdoor advertisement displaying and product image displaying.

In the specific use, the staff will generally assemble several small LED display screens together to form a large integrated display screen to display text, images, video and other information. This large integrated display screen can improve the size of the display screen so as to improve the effect of displaying and showing.

Figure 1:
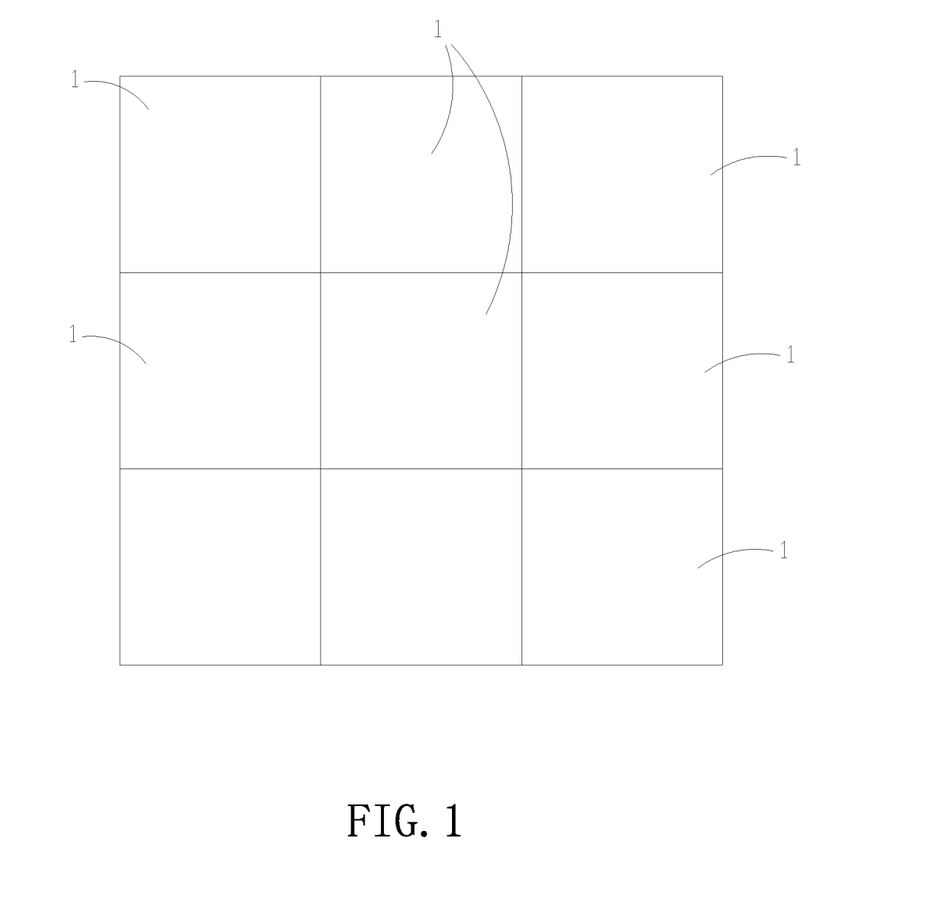
FIG. 1 is a front view of a traditional large integrated display.

FIG. 1 is the main view of a large integrated display screen which is assembled by several display boxes 1.

Figure 2:
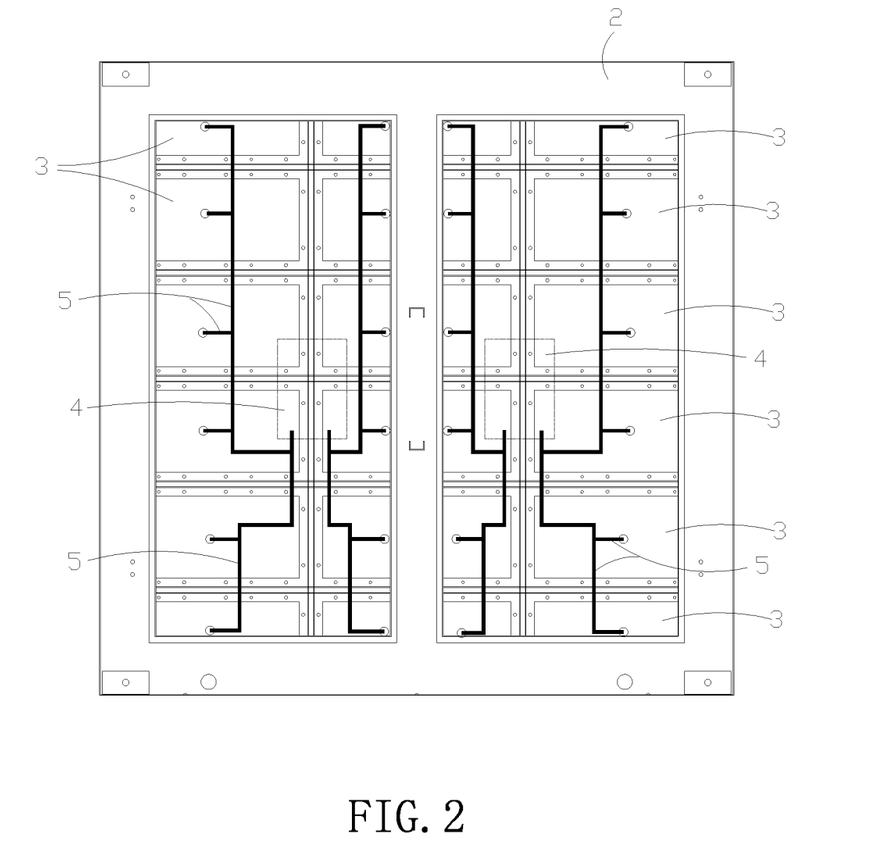
FIG. 2 is a rear view of the traditional display box with the door leaf structure removed.

As shown in FIG. 2, each of the display boxes 1 includes an outer frame 2, a plurality of modules 3, and a power box 4, wherein the modules 3 are installed on the outer frame 2, and the power box 4 is connected on the back of the display box 1. The power box 4 is used to set electronic components such as IC, PCB, etc. The modules 3 are fixedly connected to the power box 4 at the same time through circuit wires 5.

Figure 3:
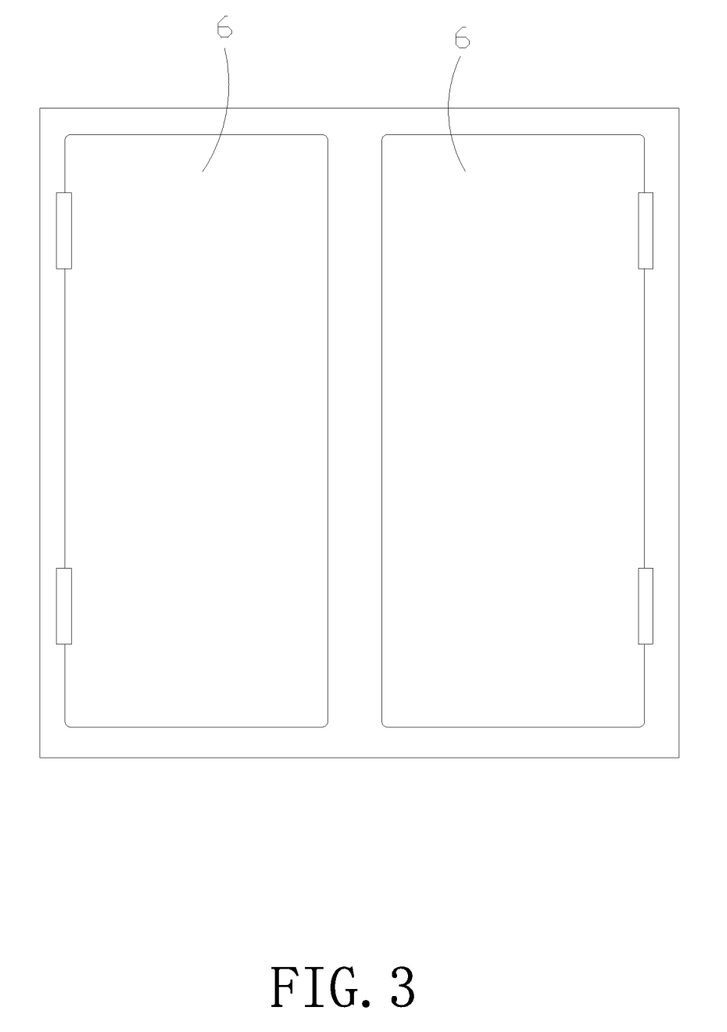
FIG. 3 is a rear view of a conventional display box.

As shown in FIG. 3, in order to cover the complicated power supply, controller, wires, cables, IC, PCB and other electronic elements arranged on the back of the LED display, the traditional LED display is usually provided with a door 6 on the back which is connected to the outer frame 2 being used to cover the circuits, electronic elements, connecting wires, etc.

The above-mentioned conventional LED display screen still has the following disadvantages.

First of all, because the outer frame 2 is in a certain size, the number of modules 3 that can be assembled is also fixed. This design restricts the product, that is to say the user cannot freely determine the size and configuration of the large integrated display screen according to objective needs, which results relatively large restrictions on specific use.

Secondly, because the power box 4 integrates all of the power supplies and control elements of several modules 3, the overall cost is low, however, the modules 3 is in a certain number, so the randomness and convenience of assembling are greatly reduced.

Thirdly, because each module 3 must be connected to the power box 4, the controller and other components to work, the internal circuit is very complicated.

SUMMARY OF THE INVENTION

The first object of the present invention is providing a modular distributed control LED display system, each of the LED display module units has the same structural form and circuit layout, and at the same time, they have the same control method and wiring method, that is to say, the LED display module unit has the characteristics of modularization, and the LED display module units are same, so it is convenient for production, and suitable for mass production, and it has a wide versatility. The second object of the present invention is providing a modularized distributed control LED display system, which enables users to open or lock the connection lock from the back and front of the lamp board respectively, so as to facilitate the disassembly and assembly.

A modular distributed control LED display system, comprising several LED display module units (100) which are spliced together to form an integrated LED display screen, each of the LED display module units (100) comprises a lamp board (110) and an independent controller (120), wherein the lamp board (110) is provided with a number of LED light sources, and the independent controller (120) is provided on the back of the lamp board (110), the independent controller (120) is used to control the working state and display mode of the LED light sources, the independent controller (120) is provided with an independent power module (121) and an independent control module (122), the independent controller (120) is provided with an input jack (130) and an output jack (140), the input jack (130) is detachably plugged with an input connecting cable (150), and the output jack (140) is detachably plugged with an output cable (160), when several LED display module units (100) are spliced together to form the integrated LED display screen, the input connecting cable (150) and the output connecting cable (160) are connected between any two adjacent LED display module units (100).

DETAILED DESCRIPTION OF THE INVENTION

As shown in FIGS. 4 to 14, a modular distributed control LED display system includes several LED display module units 100, and several LED display module unit bodies 100 are spliced together to form an integrated LED display screen.

Figure 4:
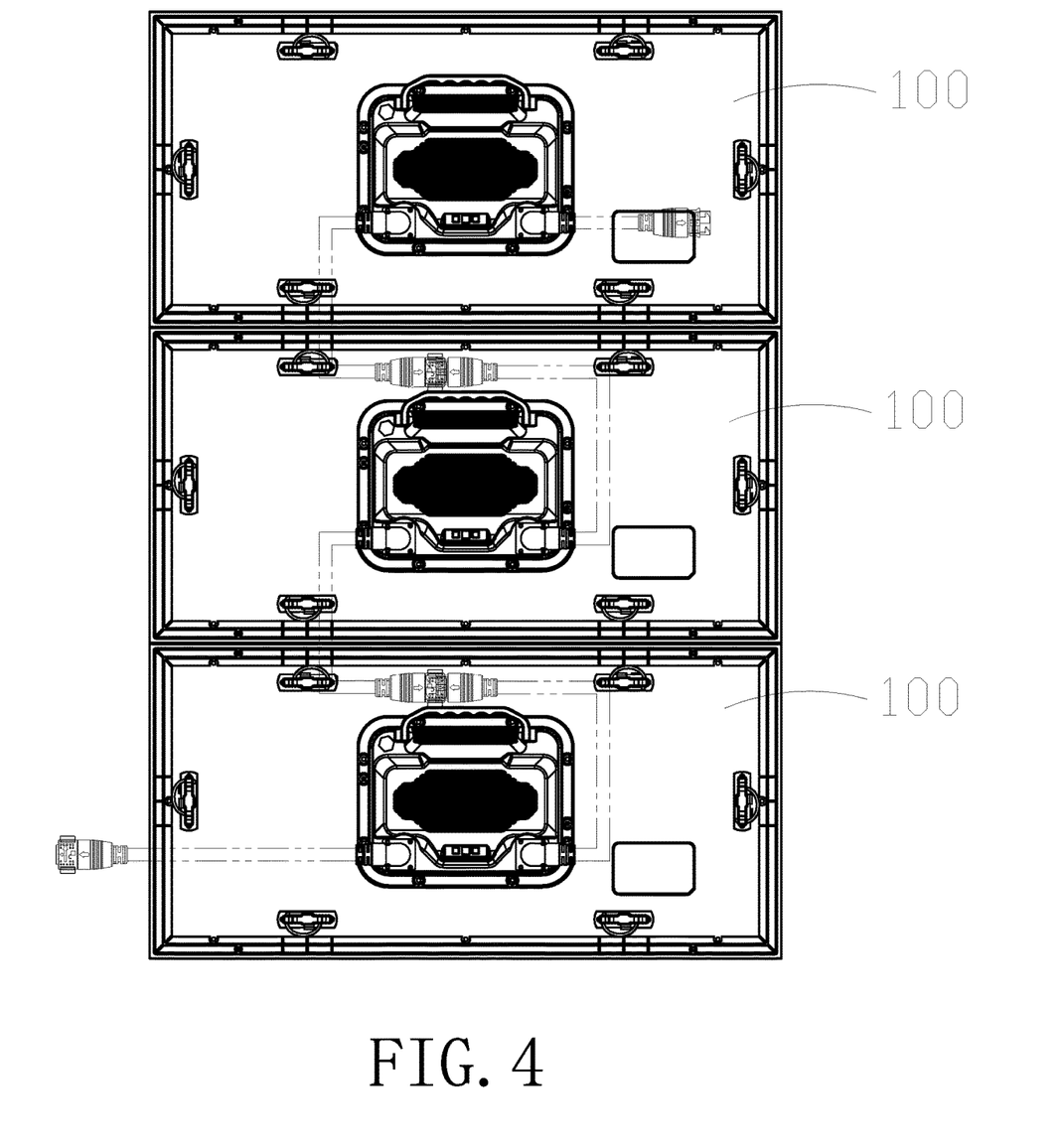
FIG. 4 shows the up and down splicing of the LED display module units of the present invention.

In practice, as shown in FIG. 4, the LED display module units 100 can be spliced up and down to form the integrated LED display screen.

Figure 5:
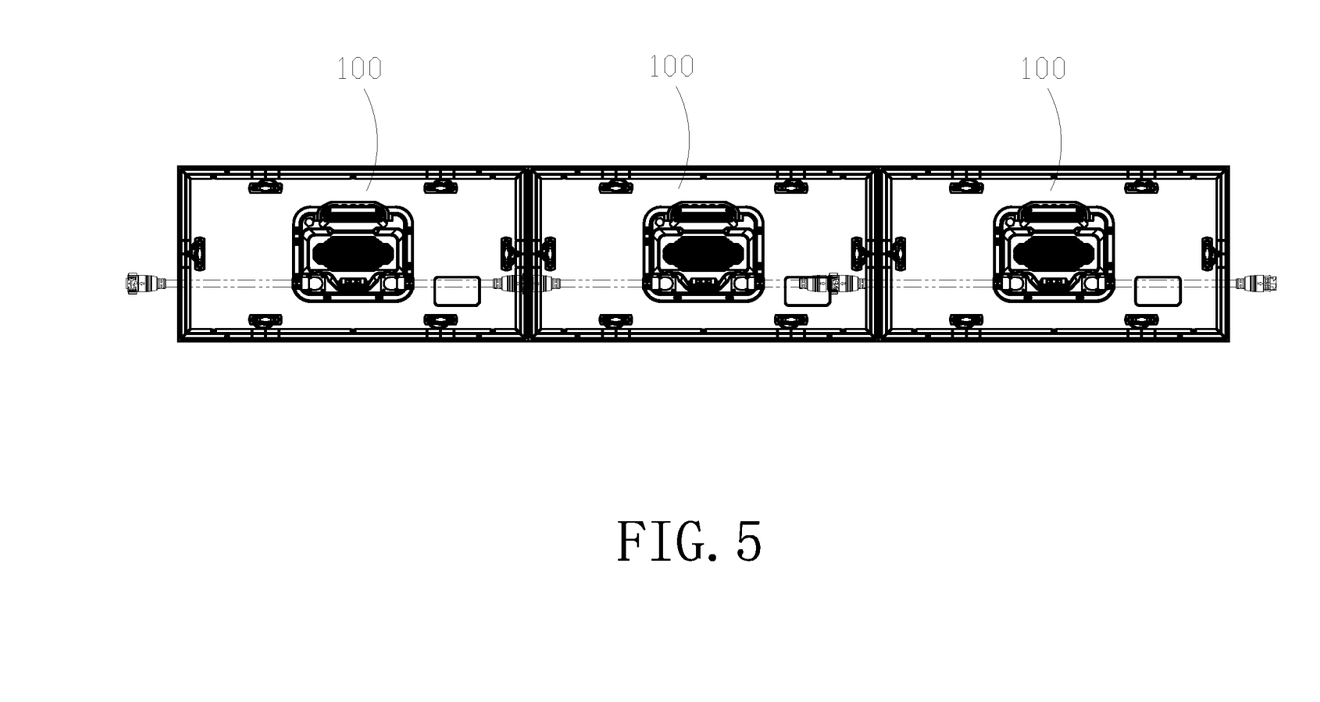
FIG. 5 shows the left and right splicing of the LED display module units of the present invention.

As shown in FIG. 5, the LED display module units 100 can also be spliced left and right to form the integrated LED display screen.

Figure 6:
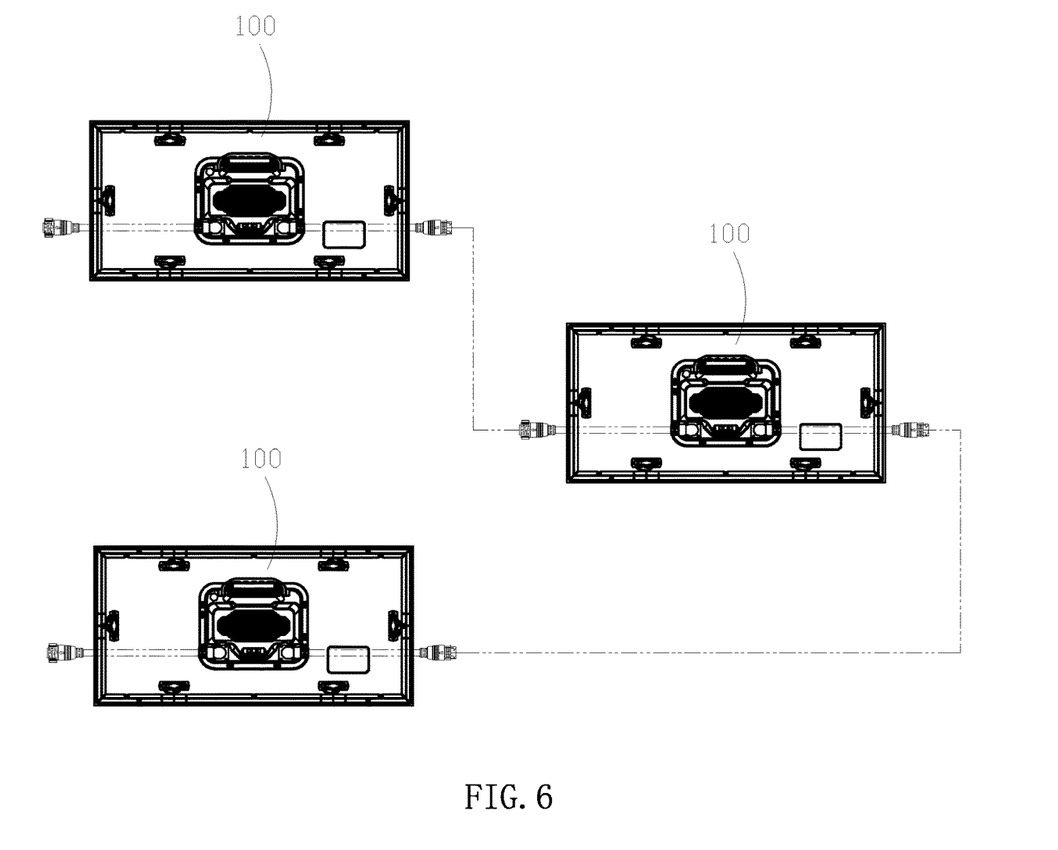
FIG. 6 is a schematic diagram of the dispersed arrangement of the LED display module unit of the present invention.

As shown in FIG. 6, the LED display module units 100 can also be distributed and connected together to form the integrated LED display screen.

Figure 7:
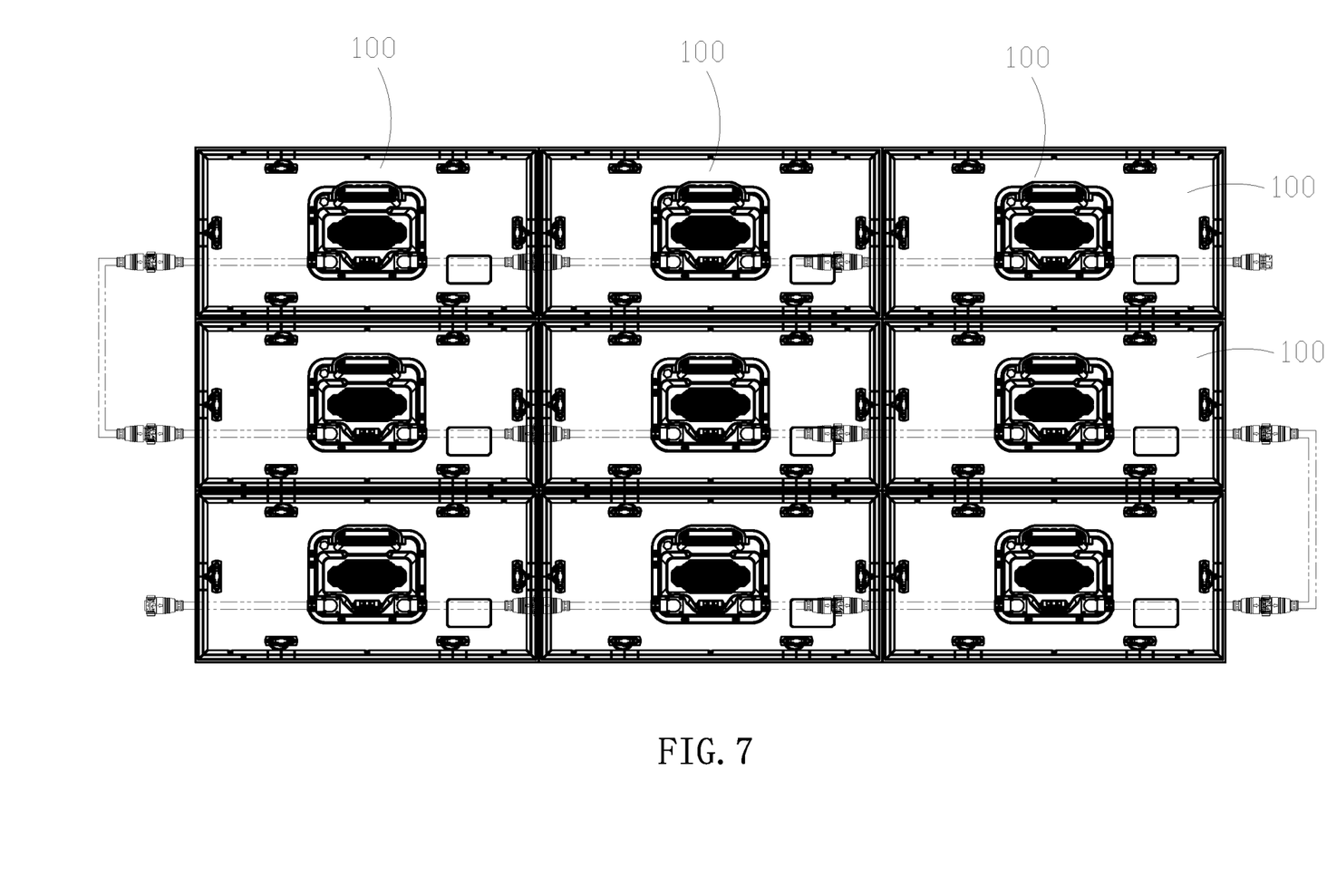
FIG. 7 is a schematic view of the LED display module unit of the present invention being spliced up-down and left-right at the same time.

As shown in FIG. 7, the LED display module units 100 can also be spliced up-down and left-right at the same time to form the integrated LED display screen.

Each of the LED display module units 100 has the same structure and circuit layout, and at the same time, it has the same control method and wiring method, that is to say, each of the LED display module units 100 has the same structure and circuit layout, and at the same time, they have the same control method and wiring method, that is to say, the LED display module unit 100 has the characteristics of modularization, and the LED display module units 100 are same, so it is convenient for production, and suitable for mass production, and has a wide versatility.

Figure 8:
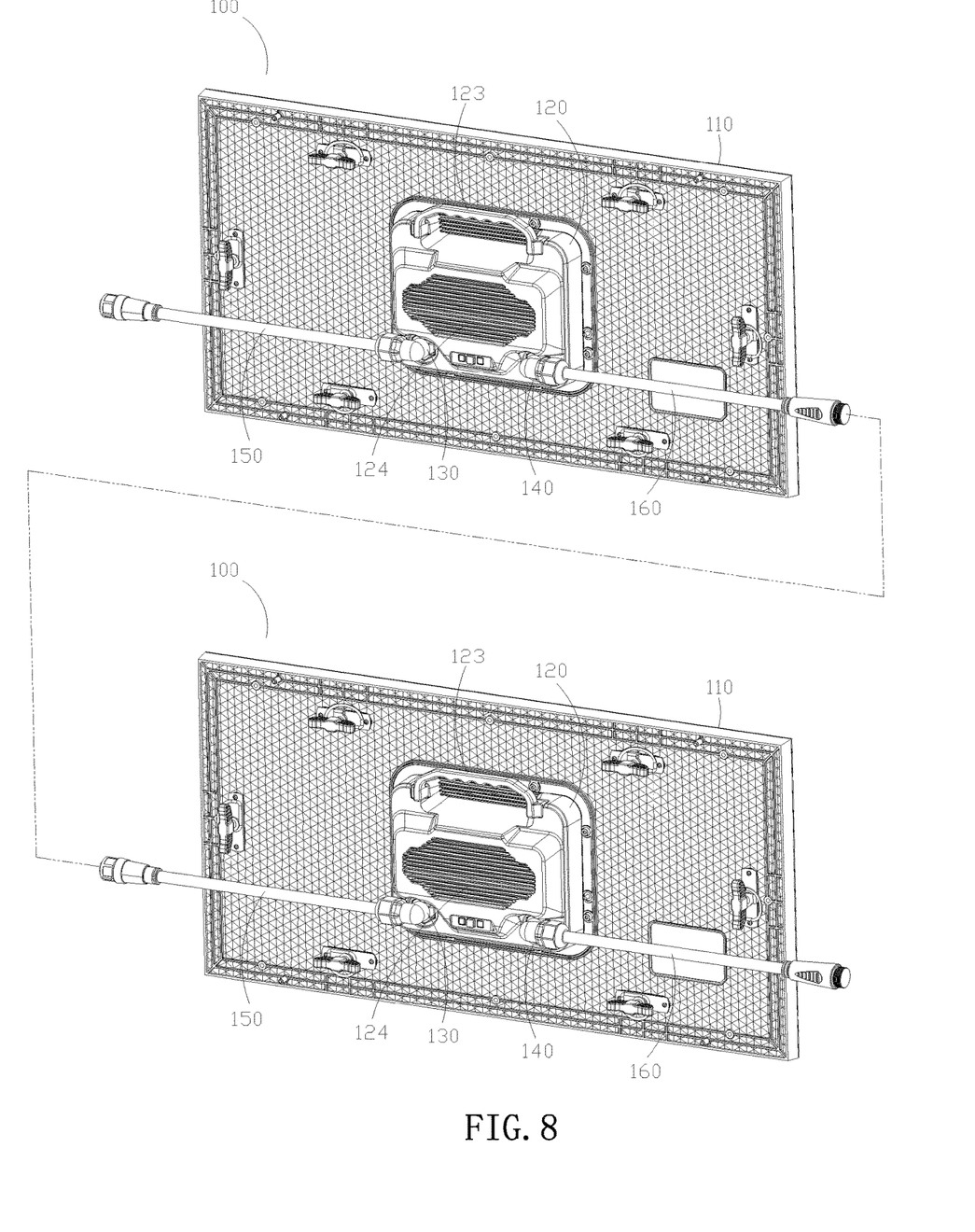
FIG. 8 is a rear perspective view of the LED display module unit of the present invention.
Figure 9:
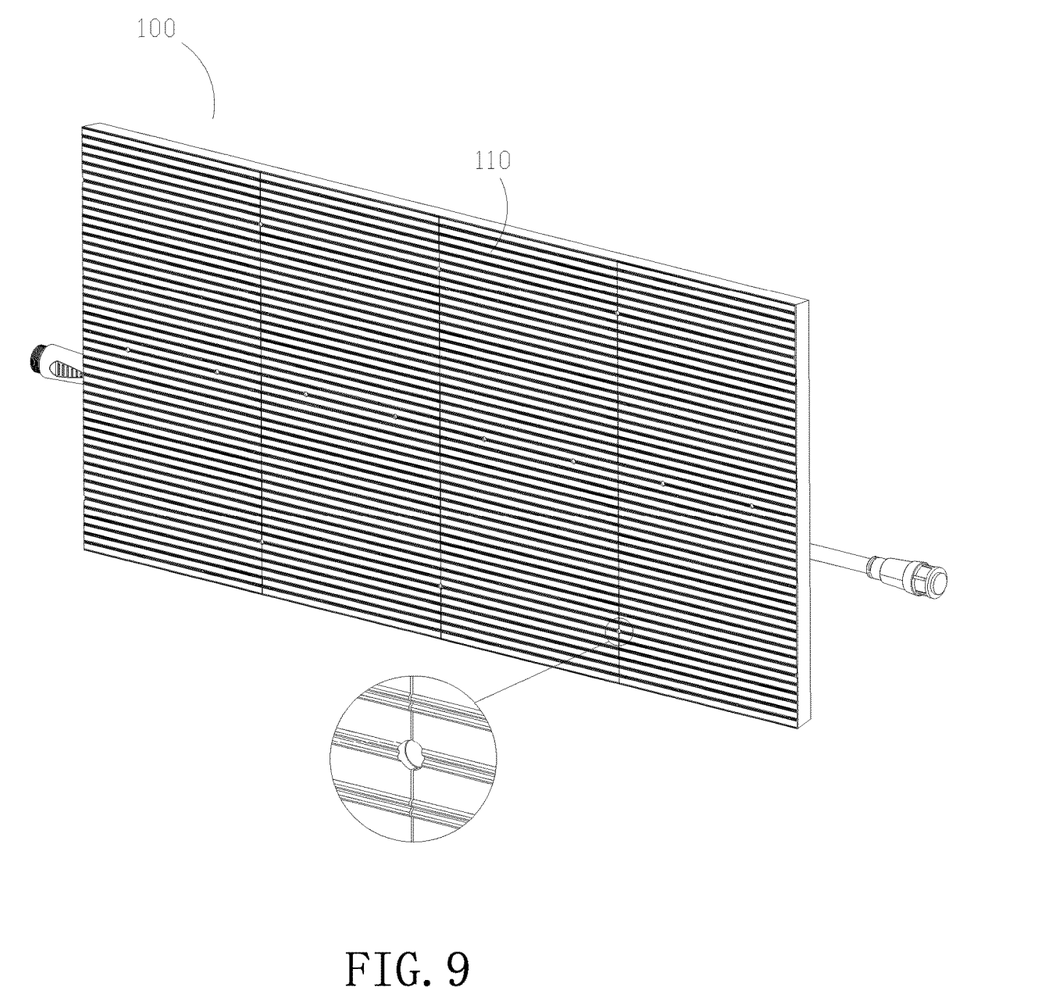
FIG. 9 is a front perspective view of the LED display module unit of the present invention.

As shown in FIGS. 8 and 9, each of the LED display module unit 100 includes a lamp board 110 and an independent controller 120, wherein the lamp board 110 is provided with a plurality of LED light sources.

The independent controller 120 is disposed on the back of the lamp board 110, and is used to control the working states and displaying modes.

Figure 10:
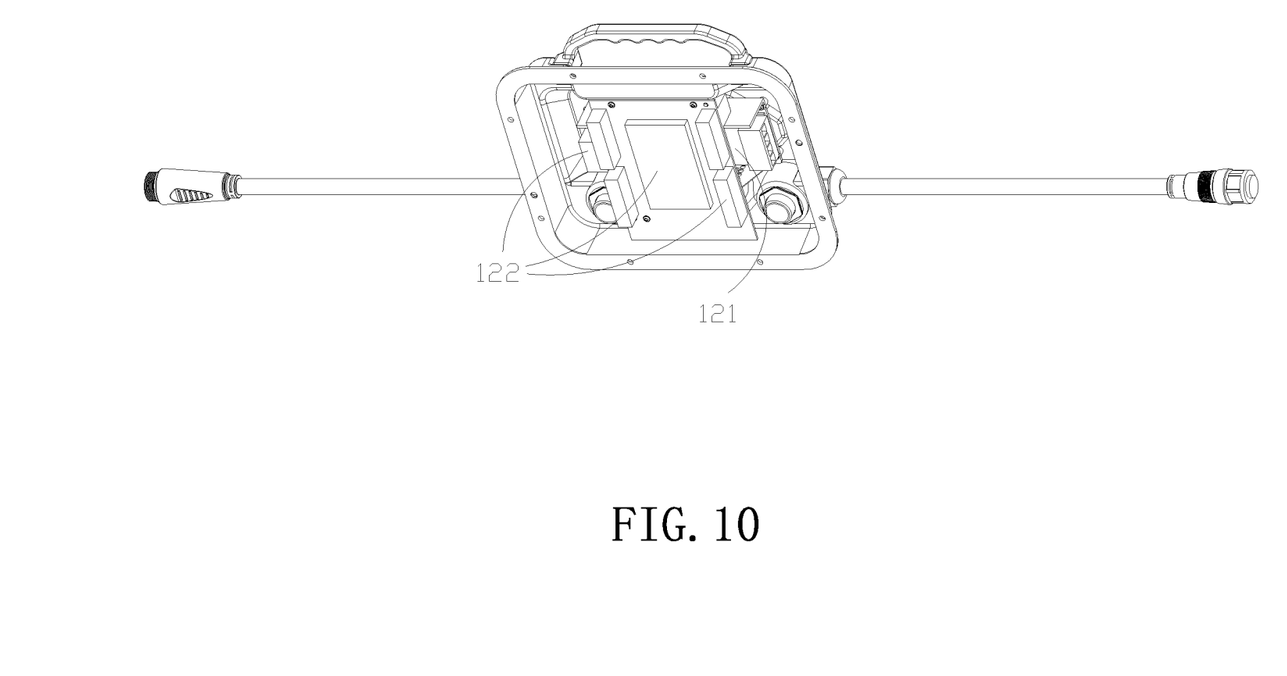
FIG. 10 is a perspective view of an independent controller of the present invention.

As shown in FIG. 10, the independent controller 120 is provided with an independent power module 121 and an independent control module 122. The independent power module 121 provides power to the lamp board 110. The control module 122 controls the working states and display modes of the LED light sources arranged on the lamp board 110.

In specific implementation, the independent control module 122 may include a module circuit such as a control card, an information transmission module, and a signal transmission/reception module, and a control circuit.

As shown in FIG. 8, the independent controller 120 is provided with an input jack 130 and an output jack 140. The input jack 130 is detachably plugged with an input connecting cable 150. The output jack 140 is detachably plugged with an output connecting cable 160.

When the LED display module units 100 are spliced together to form a integrated LED display screen, the input connecting cable 150 and the output connecting cable 160 are connected between any two adjacent LED display module units 100 to connect the LED display module units 100 to form an integrated display.

The specific description is that when two LED display module units 100 are connected, the output connecting cable 160 of one is the input connecting cable 150 of another.

The integrated power modules and the control modules in the traditional LED display power box can be separated one by one, and are independently arranged in an independent controller 120 of each LED display module unit 100, so that the LED display module unit 100 has a modular feature. Although this product will slightly increase the cost, it can significantly improve the convenience of use, the convenience and randomness of modules assembling, and greatly improve the user's experience. In a specific implementation, the input jack 130 and the output jack 140 are integrated with a power transmission part and a signal transmission part, wherein the power transmission part is used to transmit current, and the signal transmission part is used to transmit control signals, network signals, etc.

In specific implementation, the input connecting cable 150 and the output connecting cable 160 are integrated with a power transmission line and a signal transmission line, wherein the power transmission line is used to transmit current, and the signal transmission line is used to transmit control signals, network signals, etc.

In specific implementation, the input connecting cable 150 and the output connecting cable 160 may be cable or aerial lines.

Figure 15:
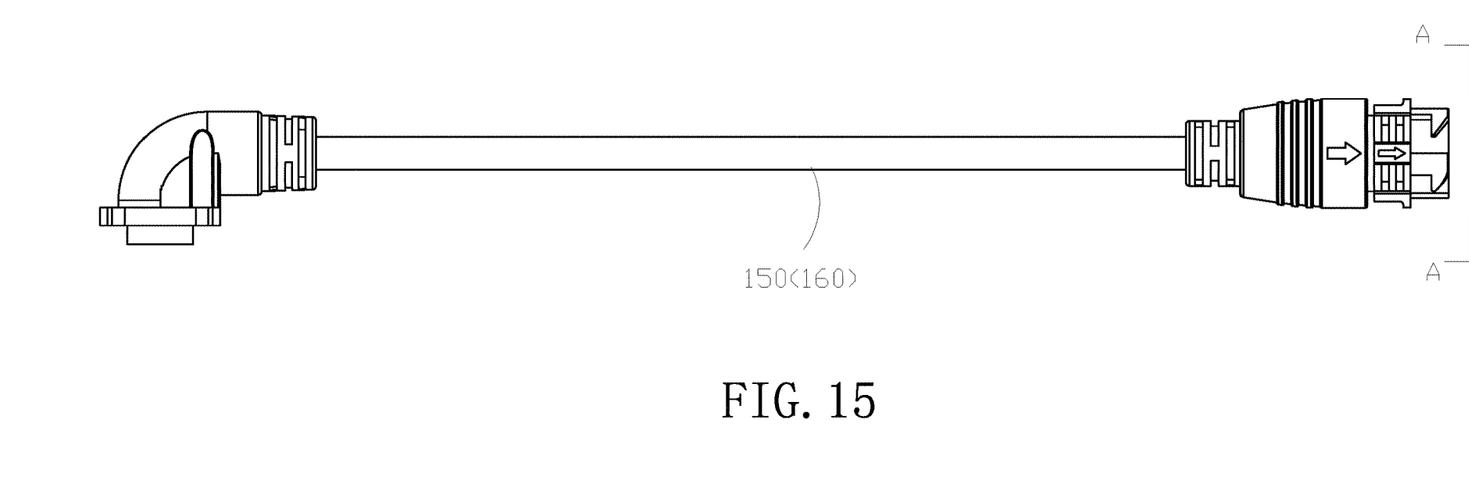
FIG. 15 is a schematic diagram of the input connection line and the output connection line of the present invention.
Figure 16:
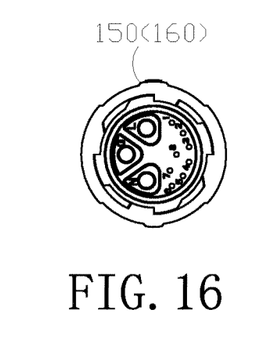
FIG. 16 is a view taken along the line A-A in FIG. 15.

As shown in FIGS. 15 and 16, in practice, the input connecting cable 150 and the output connecting cable 160 are composed of 8 network lines and 3 power lines, wherein the 3 power lines are live, neutral and ground Line, the 8 network lines are standard network lines.

In specific implementation, the independent controller 120 is provided with a handle 123 to facilitate the user to carry.

In specific implementation, the independent controller 120 is provided with a heat sink 124 to facilitate heat dissipation of the independent controller 120.

Figure 11:
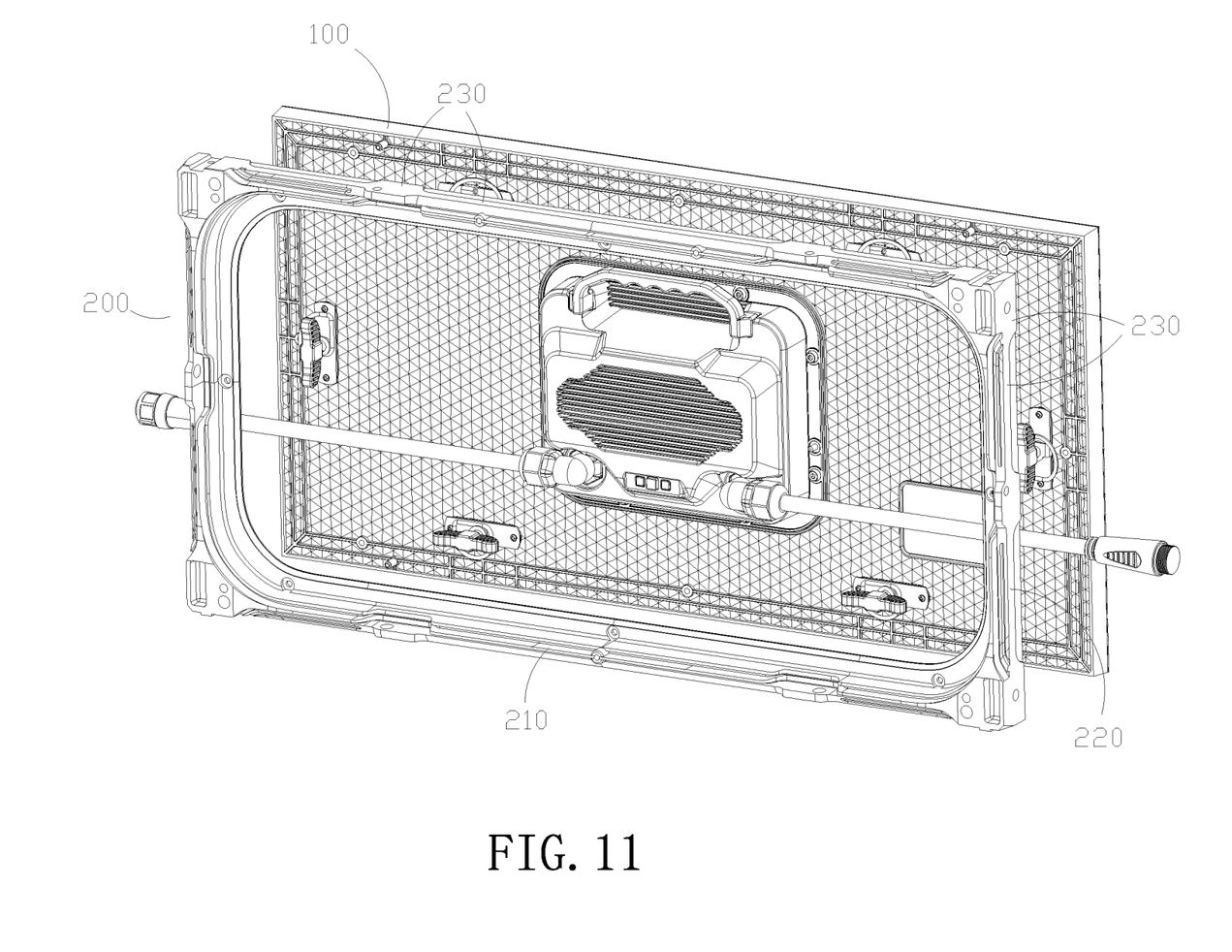
FIG. 11 is an exploded view of the LED display module unit and the splicing frame of the present invention.
Figure 12:
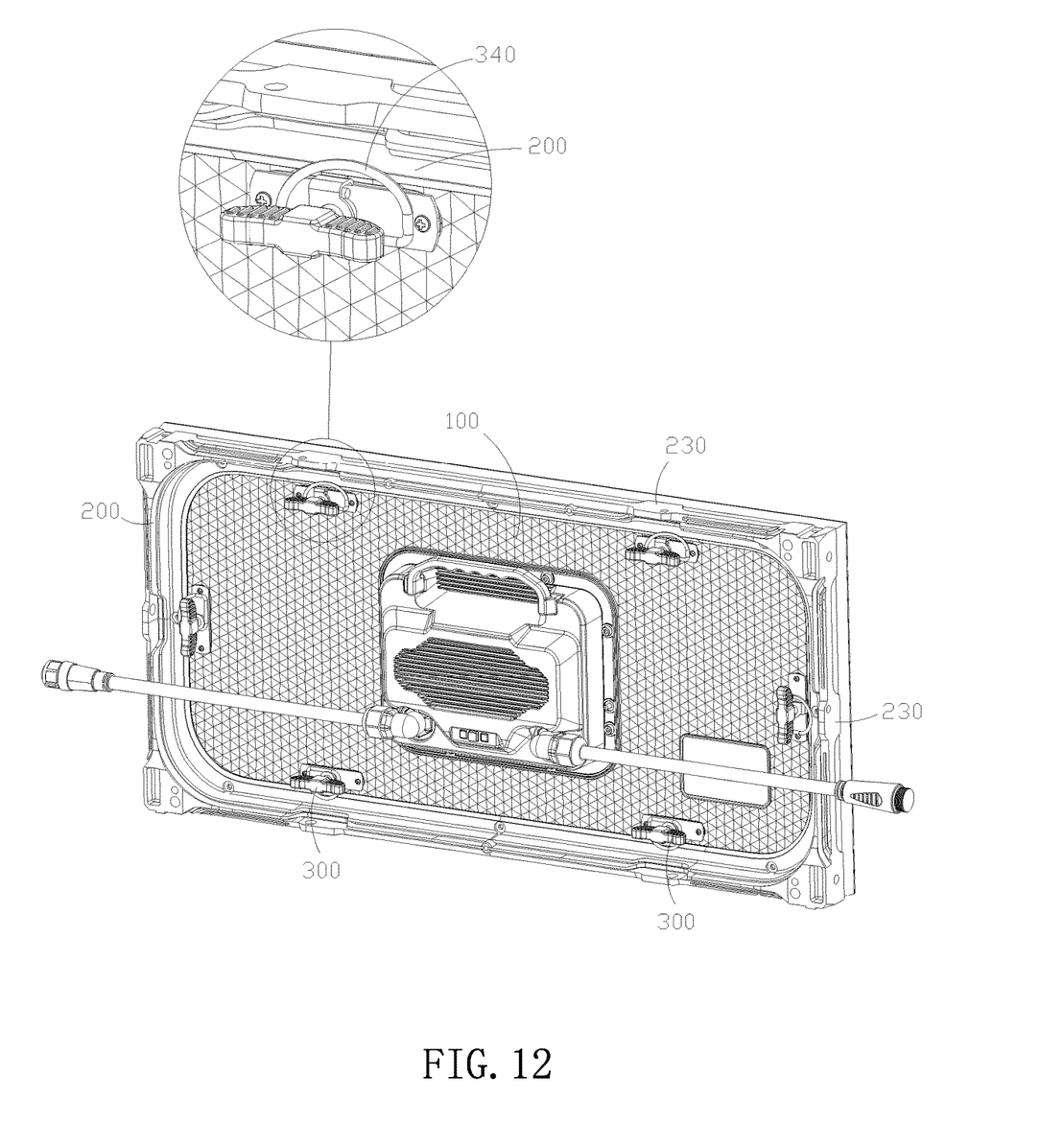
FIG. 12 is a schematic diagram of the LED display module unit of the present invention being assembled in a splicing frame.

As shown in FIGS. 11 and 12, each of LED display module units 100 can be detachably assembled in a splicing frame 200.

The LED display module unit 100 is assembled in the splicing frame 200, and a plurality of the splicing frames 200 are connected to each other, so that a plurality of the LED display module units 100 are spliced together to form an integrated LED display screen.

In specific implementation, any two adjacent splicing frames 200 are connected and locked by a fixed lock, which can fix the position of the splicing frames 200 and improve the strength of the integrated LED display.

In specific implementation, the splicing frame 200 includes a horizontal frame 210 and a vertical frame 220.

The horizontal frame 210 and the vertical frame 220 are connected together to form the splicing frame 200. In practice, the splicing frame 200 is rectangular.

Both the horizontal frame 210 and the vertical frame 220 are provided with a splicing surface 230 on the outside, when two splicing frames 200 are assembled, two splicing surfaces 230 of which Laminated together so that there is no gap between the splicing frames 200.

As shown in FIGS. 11 and 12, each of the LED display module units 100 is provided with a connecting lock 300, which is located between the LED display module unit 100 and the splicing frame 200.

When the connecting lock 300 is opened, the LED display module unit 100 can be removed from the splicing frame 200.

When the connecting lock 300 is locked, the LED display module unit 100 is locked in the splice frame 200 through the connecting lock 300.

It is convenient for the user to remove the LED display module unit 100 from the splicing frame 200 for replacement, repair or maintenance by the connecting lock 300.

Figure 13:
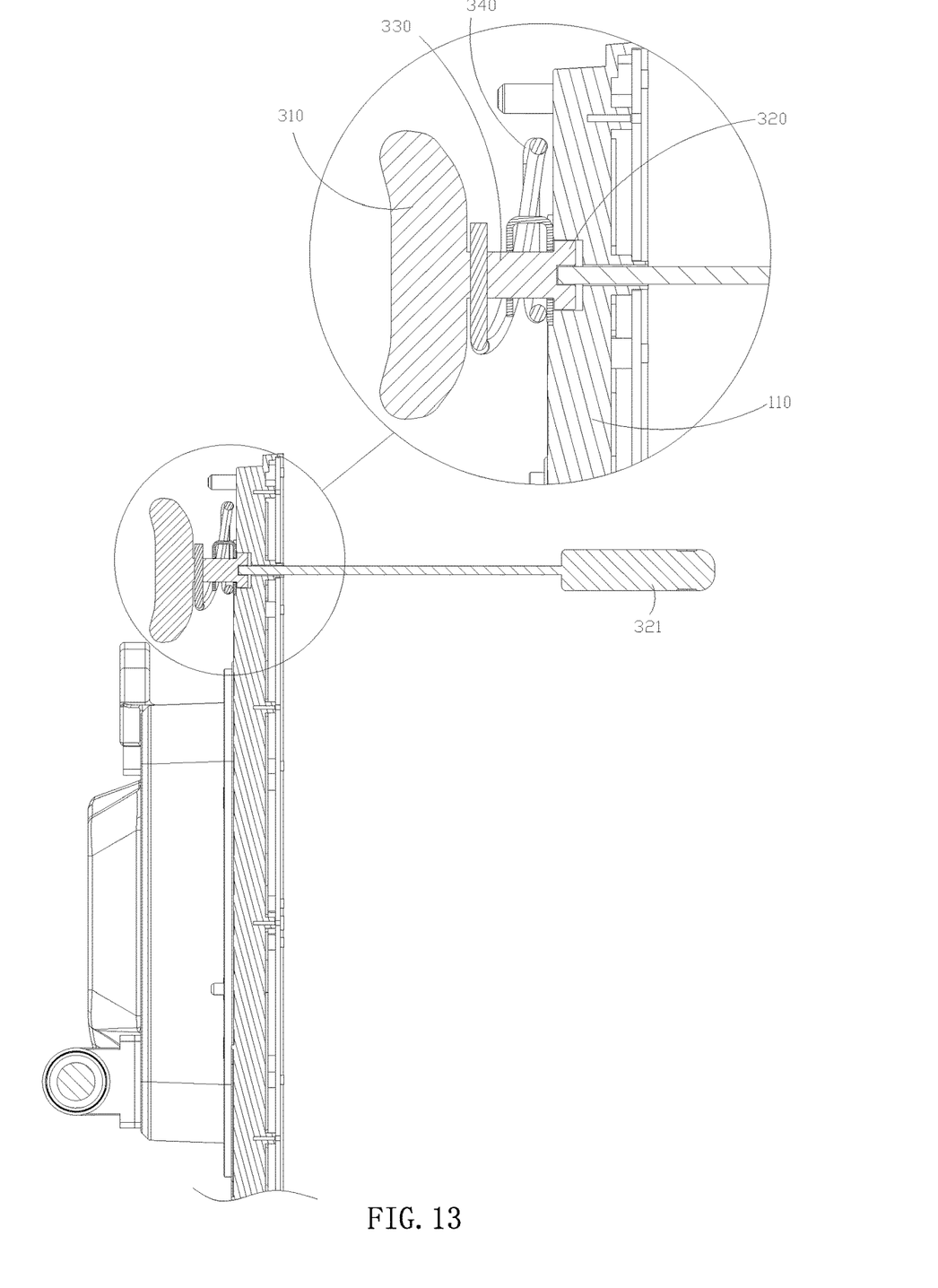
FIG. 13 shows the rear opening structure and the front opening structure of the present invention.
Figure 14:
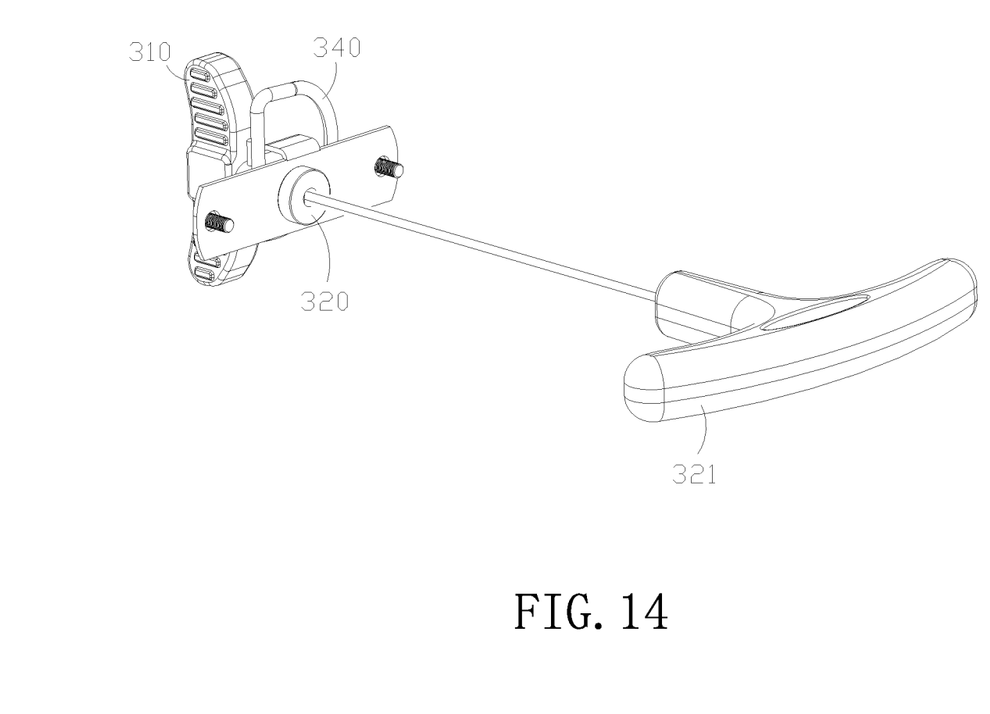
FIG. 14 is a perspective view of the rear opening structure and the front opening structure of the present invention.

As shown in FIGS. 13 and 14, the connecting lock 300 includes a rear opening structure 310 and a front opening structure 320. Both the rear opening structure 310 and the front opening structure 320 are connected to the connecting lock 300.

In specific implementation, both the rear opening structure 310 and the front opening structure 320 are coaxially connected to the connecting lock 300, wherein the rear opening structure 310 is located on the back of the lamp board 110, and the front opening structure 320 is in the front of the lamp board 110.

The user can open the connecting lock 300 from the back of the lamp board 110 through the rear opening structure 310.

At the same time, the user can open the connecting lock 300 from the front of the lamp board 110 through the front opening structure 320.

As described above, the present invention enables users to open or lock the connecting lock 300 from the back and the front of the lamp board 110 respectively, which facilitates the disassembly and assembly.

In practice, when the LED display module units 100 are spliced to form an integrated LED display screen, if the integrated LED display screen is against the wall, the gap between the integrated LED display screen and the wall is often small. In this case, the user can not reach the back of the integrated LED display. At this time, the user can open the connecting lock 300 through the front opening structure 320 in front of the lamp board 110, which can greatly improve the efficiency and convenience of disassembly and assembly.

In specific implementation, the connecting lock 300 includes a rotating shaft 330 and a locking structure 340.

The locking structure 340 is fixedly connected to the rotating shaft 330, and the locking structure 340 can rotate synchronously with the rotating shaft 330.

In specific implementation, the locking structure 340 is an elastic ring rod.

The rear opening structure 310 is provided at the rear end of the rotating shaft 330, while the front opening structure 320 is provided at the front end.

In specific implementation, the rear opening structure 310 is a rotary button.

The front opening structure 320 is a hexagon socket.

When in use, the user can manually turn the rotary button to make the locking structure 340 and the rotating shaft 330 rotate synchronously, so as to open or lock the connecting lock 300, when the locking structure 340 rotates and is stuck on the splicing frame 200, the LED display module unit 100 can be assembled in the splicing frame 200.

Similarly, the user can insert the front opening tool 321 into the hexagonal rotating rod and rotate it to make the locking structure 340 and the rotating shaft 330 rotate synchronously so as to open or lock the connecting lock 300.

In practice, the front opening structure 320 is hidden and embedded in the lamp board 110 to achieve the purpose of not blocking the image displaying.

In specific implementation, a plurality of connecting locks 300 may be provided around the lamp board 110 to ensure a safe connection.

What is claimed is:

1. A modular distributed control LED display system, comprising several LED display module units (100) which are spliced together to form an integrated LED display screen, each of the LED display module units (100) comprises a lamp board (110) and an independent controller (120), wherein the lamp board (110) is provided with a number of LED light sources, and the independent controller (120) is provided on the back of the lamp board (110), the independent controller (120) is used to control the working state and display mode of the LED light sources, the independent controller (120) is provided with an independent power module (121) and a independent control module (122), the independent controller (120) is provided with an input jack (130) and an output jack (140), the input jack (130) is detachable plugged with an input connecting cable (150), and the output jack (140) is detachable plugged with an output cable (160), when several LED display module unit (100) are spliced to form the integrated LED display screen, the input connecting cable (150) and the output connecting cable (160) are connected between any two adjacent LED display module units (100), wherein each of the LED display module units (100) is detachably assembled in a splicing frame (200), a number of the splices frames (200) are connected to each other, so that the LED display module unit (100) are spliced together to form the integrated LED display screen, the LED display module unit (100) can be assembled in the splicing frame (200) and a front from the front, and can also be assembled in the splicing frame (200) from the back, each of the LED display module units (100) is provided with a connecting lock (300) which is positioned between the LED display module unit (100) and the splicing frame (200), when the connecting lock (300) is opened, the LED display module unit (100) can be removed from the splicing frame (200), when the connecting lock (300) is locked, the LED display module unit (100) is locked in the splicing frame (200) by the connecting lock (300), the connecting lock (300) comprises a rear opening structure (310) and a front opening structure (320), wherein the rear opening structure (310) is arranged on the back of the lamp board (110), and the front opening structure (320) is arranged in the front of the board (110), the user can open the connection lock (300) from the back of the lamp board (110) through the rear opening structure (310), and at the same time, the user can also open the connection lock (300) from the front of the lamp board (110) through the front opening structure (320).

2. A modular distributed control LED display system according to claim 1, wherein the rear opening structure (310) and the front opening structure (320) are simultaneously connected to the connecting lock (300).

3. A modular distributed control LED display system according to claim 1, wherein the connecting lock (300) comprises a rotating shaft (330) and a locking structure (340), the locking structure (340) is fixedly connected to the rotating shaft (330), and can rotate synchronously with the rotating shaft (330), the rear opening structure (310) is arranged at the rear end of the rotating shaft (330), and the front opening structure (320) is arranged at the front end of the rotating shaft (330), when in use, the user can manually turn the rotary button to make the locking structure (340) and the rotating shaft (330) rotate synchronously, so as to open or lock the connecting lock (300), when the locking structure (340) rotates and is stuck on the splicing frame (200), the LED display module unit (100) can be assembled in the splicing frame (200), similarly, the user can insert the front opening tool (321) into the front opening structure (320) and rotate it, thus make the locking structure (340) and the rotating shaft (330) rotate synchronously, so as to open or lock the connecting lock (300).

4. A modular distributed control LED display system according to claim 3, wherein the locking structure (340) is an elastic ring rod, the rear opening structure (310) is a rotary button, and the front opening structure (320) is a hexagonal rotating rod.

\* \* \* \* \*